United States Patent
Houng (10) Patent No.: US 11,581,181 B2
(45) Date of Patent: *Feb. 14, 2023

(54) ORIENTATION CHAMBER OF SUBSTRATE PROCESSING SYSTEM WITH PURGING FUNCTION

(71) Applicant: Taiwan Semiconductor Manufacturing Company, Ltd., Hsinchu (TW)

(72) Inventor: Wei-Hua Houng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 152 days.

This patent is subject to a terminal disclaimer.

(21) Appl. No.: 17/106,999

(22) Filed: Nov. 30, 2020

(65) Prior Publication Data

US 2021/0111016 A1    Apr. 15, 2021

Related U.S. Application Data

(63) Continuation of application No. 16/395,377, filed on Apr. 26, 2019, now Pat. No. 10,854,442.
(Continued)

(51) Int. Cl.
*H01L 21/02* (2006.01)
*H01L 21/67* (2006.01)
(Continued)

(52) U.S. Cl.
CPC .. *H01L 21/02057* (2013.01); *H01L 21/67028* (2013.01); *H01L 21/67207* (2013.01);
(Continued)

(58) Field of Classification Search
None
See application file for complete search history.

(56) References Cited

U.S. PATENT DOCUMENTS 6,040,585 A * 3/2000 Hsiao ............... H01L 21/681
414/217
8,712,730 B2    4/2014 Kataoka et al.
(Continued)

FOREIGN PATENT DOCUMENTS

CN    101399217 A    4/2009
CN    201812803 U    4/2011
(Continued)

*Primary Examiner* — J. E. Schoenholtz
(74) *Attorney, Agent, or Firm* — McClure, Qualey & Rodack, LLP (57) ABSTRACT

An orientation chamber is provided. The orientation chamber includes a substrate holder, an orientation detector, and a purging system. The substrate holder is configured to hold a substrate. The orientation detector is configured to detect an orientation of the substrate. The purging system is configured to inject a cleaning gas into the orientation chamber and remove contaminants from the substrate. The purging system includes a gas regulator adjusting a volume of the cleaning gas supplied into the orientation chamber according to a detection signal output from a gas detector which indicates a content of a specific gas contaminant outgassed from the substrate.

20 Claims, 5 Drawing Sheets

Related U.S. Application Data (60) Provisional application No. 62/691,918, filed on Jun. 29, 2018.

(51) Int. Cl.
*H01L 21/677* (2006.01)
*H01L 21/68* (2006.01)

(52) U.S. Cl.
CPC .. *H01L 21/67265* (2013.01); *H01L 21/67703* (2013.01); *H01L 21/681* (2013.01); *G05B 2219/45031* (2013.01)

(56) References Cited

U.S. PATENT DOCUMENTS

| | | | |
|---|---|---|---|
| 9,384,993 | B2 | 7/2016 | Suemasa |
| 9,960,056 | B2 | 5/2018 | Dobashi et al. |
| 10,854,442 | B2* | 12/2020 | Houng .............. H01L 21/67028 |
| 2003/0017628 | A1 | 1/2003 | Li et al. |
| 2007/0093071 | A1 | 4/2007 | Verhaverbeke et al. |
| 2009/0087932 | A1 | 4/2009 | Kondoh |
| 2014/0111797 | A1 | 4/2014 | Kitamura et al. |
| 2015/0255316 | A1 | 9/2015 | Dobashi et al. |
| 2015/0348773 | A1* | 12/2015 | Zhu .................... H01J 37/3467 438/503 |
| 2016/0155652 | A1 | 6/2016 | Burgess et al. |
| 2017/0040203 | A1 | 2/2017 | Caveney et al. |
| 2017/0110354 | A1 | 4/2017 | Daugherty et al. |
| 2018/0148834 | A1 | 5/2018 | Kamimura et al. |
| 2020/0105561 | A1 | 4/2020 | Yoon et al. |
| 2020/0126802 | A1* | 4/2020 | Lee ................... H01L 21/67742 |

FOREIGN PATENT DOCUMENTS

| | | |
|---|---|---|
| CN | 102280362 A | 12/2011 |
| KR | 10-0809275 B1 | 3/2008 |
| TW | 201409568 A | 3/2014 |
| TW | 201426900 A | 7/2014 |

* cited by examiner

ORIENTATION CHAMBER OF SUBSTRATE PROCESSING SYSTEM WITH PURGING FUNCTION

CROSS REFERENCE TO RELATED APPLICATIONS

The present application is a Continuation Application of U.S. patent application Ser. No. 16/395,377, filed on Apr. 26, 2019, issued on Dec. 1, 2020 as U.S. Pat. No. 10,854,442, which claims priority of U.S. Provisional Patent Application No. 62/691,918, filed on Jun. 29, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering the associated costs. Such scaling down, however, has increased the complexity of IC processing and manufacturing. For example, as feature size shrinks, the associated circuits become more sensitive to contamination during the manufacturing process.

Cluster tools have been an important development in semiconductor manufacturing. By providing multiple tools within a single chassis, several manufacturing procedures can be performed on a semiconductor substrate without exposing it to the external environment with a large amount of contaminants. The seals within the cluster tool can be used to create different atmospheric zones. For example, the process modules and the central transfer chamber may operate in a vacuum while the load lock chambers and the substrate transport carrier operate in an inert gas atmosphere. Furthermore, because the substrate is not directly exposed to the fab environment, a less particle atmosphere can be maintained around the substrate while the rest of the fab operates with less stringent controls.

Although systems and methods for processing semiconductor substrates have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1:
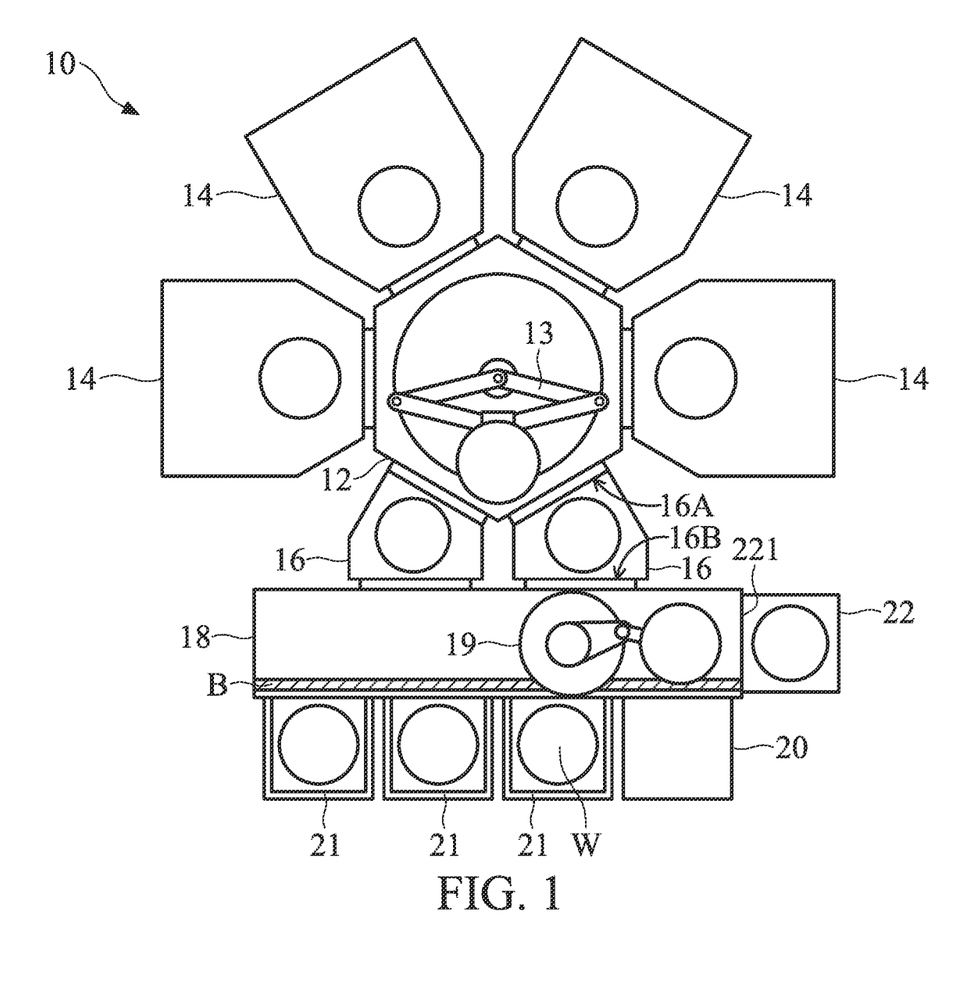
FIG. 1 is a schematic top view of a semiconductor substrate processing system, in accordance with some embodiments.

Referring to FIG. 1, in some embodiments, a semiconductor substrate processing system 10 is configured to process a substrate W. The substrate W may include one or more semiconductor, conductor, and/or insulator layers. The semiconductor layers may include an elementary semiconductor such as silicon or germanium with a crystalline, polycrystalline, amorphous, and/or another suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the substrate W may include layered semiconductors. Examples include the layering of a semiconductor layer on an insulator such as that used to produce a silicon-on-insulator (SOI) substrate, a silicon-on-sapphire substrate, or a silicon-germanium-on-insulator substrate, or the layering of a semiconductor on glass to produce a thin film transistor (TFT).

As shown in FIG. 1, the semiconductor substrate processing system 10 is a cluster tool, which includes a central transfer chamber 12 with a transfer mechanism 13 (e.g., a multi-axis robot manipulator), one or more process modules 14, one or more load lock chambers 16, an equipment front end module (EFEM) 18 with a transfer mechanism 19 (e.g., a multi-axis robot manipulator), one or more load ports 20, and an orientation chamber 22. The central transfer chamber 12 connects to the process modules 14 and to the load lock chambers 16. This configuration allows the transfer mechanism 13 to transfer the substrate W between the process modules 14 and the load lock chambers 16. It should be understood that the elements of the semiconductor substrate processing system 10 can be added or omitted in different embodiments, and the invention should not be limited by the embodiments.

The process modules 14 may be configured to perform various manufacturing procedures on the substrate W. Substrate manufacturing procedures may include deposition processes such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the substrate W; and/or any combination of procedures. In some embodiments, each process module 14 is used to perform a specific manufacturing procedure on the substrate W. In various embodiments, the substrate W may be processed by one or more process modules 14 before being sent out of the semiconductor substrate processing system 10.

In some embodiments, the area of the semiconductor substrate processing system 10 defined by the central transfer chamber 12 and the process modules 14 is sealed. Atmospheric controls, including filtering, provide an environment with extremely low levels of particulates and airborne molecular contamination (AMC), both of which may damage the substrate W. By creating a microenvironment within the semiconductor substrate processing system 10, the process modules 14 can be operated in a cleaner environment than the surrounding facilities. This allows tighter control of contaminants during substrate processing at reduced cost. Although not shown, the process modules 14 and the central transfer chamber 12 may operate in a vacuum by using a vacuum system during substrate processing.

The load lock chambers 16 may preserve the atmosphere within the central transfer chamber 12 and process modules 14 by separating them from the EFEM 18. As shown in FIG. 1, each load lock chamber 16 includes two doors, a first door 16A connecting to the central transfer chamber 12 and a second door 16B connecting to the EFEM 18. The substrate W is inserted into a load lock chamber 16 and both doors are sealed. The load lock chamber 16 is capable of creating an atmosphere compatible with the EFEM 18 or the central transfer chamber 12 depending on where the loaded substrate W is scheduled to be next. This may require altering the gas content of the load lock chamber 16 by such mechanisms as adding purified gases (or inert gases) or creating a vacuum, along with other suitable means for adjusting the load lock chamber atmosphere. When the correct atmosphere has been reached, the corresponding door may be opened, and the substrate W can be accessed. In some embodiments, a load lock chamber 16 may be configured to handle the unprocessed substrate W only, and another load lock chamber 16 may be configured to handle the processed substrate W.

The EFEM 18 may provide a closed environment in which to transfer the substrate W into and out of the semiconductor substrate processing system 10. The EFEM 18 contains the transfer mechanism 19 which performs the physical transfer of the substrate W. In some embodiments, a gas handling system (not shown) may also be configured to generate a gas interface B between the EFEM 18 and the load ports 20 to restrict the flow of air between the transport carriers 21 docked at the load ports 20 and the EFEM 18 and reduce cross-contamination.

The substrate W is loaded into and out of the semiconductor substrate processing system 10 through the load ports 20. In some embodiments, the substrate W arrives at a load port 20 contained in a transport carrier 21 such as a front-opening unified pod (FOUP), a front-opening shipping box (FOSB), a standard mechanical interface (SMIF) pod, and/or another suitable container. The transport carrier 21 is a magazine for holding one or more substrates W and for transporting substrates W between different manufacturing tools or working stations. In some embodiments, the transport carrier 21 may have features such as coupling locations and electronic tags to facilitate use with an automated materials handling system. The transport carrier 21 is sealed in order to provide a microenvironment for the substrate W contained within and to protect the substrate W and the semiconductor substrate processing system 10 against contamination. To prevent loss of the controlled atmosphere, the transport carrier 21 may have a door specially designed such that the transport carrier 21 remains sealed until it is docked with the load port 20. After being processed by one or more process modules 14, the substrate W may be transferred into another transport carrier 21 for the processed substrates W, which will be transported to the next processing system or inspection station.

The orientation chamber 22 may provide the function of orienting the substrate W prior to the subsequent manufacturing procedure(s). For example, in some embodiments shown in FIG. 1, the orientation chamber 22 connects to the EFEM 18. After the loaded substrate W is properly oriented in the orientation chamber 22 (through an orientation processing, which will be further described later), it can be transferred by the transfer mechanism 19 of the EFEM 18 to a load lock chamber 16, and then be transferred by the transfer mechanism 13 of the central transfer chamber 12 to one or more process modules 14 for the manufacturing procedures.

Figure 2:
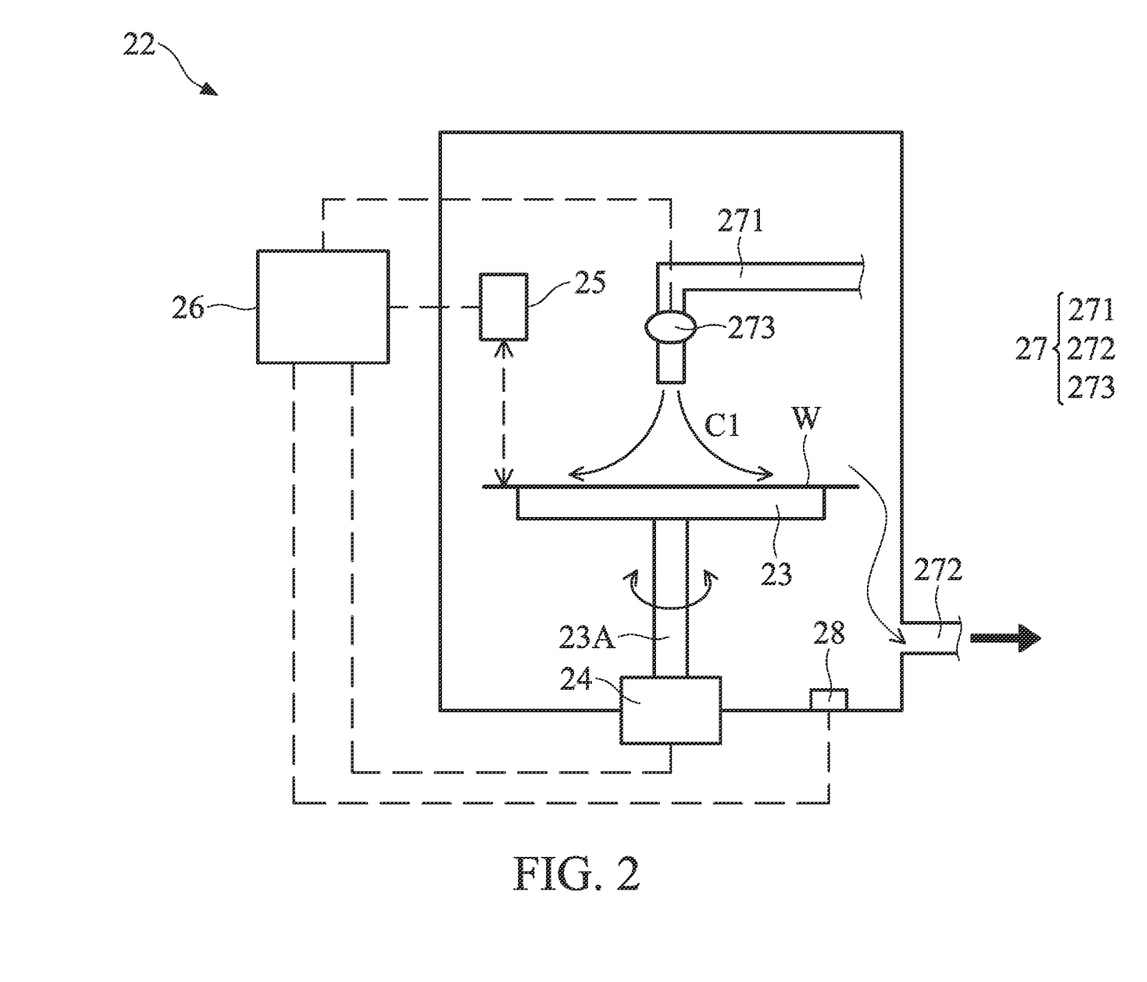
FIG. 2 is a schematic side view of the orientation chamber in FIG. 1, in accordance with some embodiments.

FIG. 2 is a schematic side view of the orientation chamber 22 in FIG. 1, in accordance with some embodiments. It should be understood that some additional elements can be added into the orientation chamber 22 in different embodiments, and some of the elements described below can be replaced or eliminated in other embodiments of the orientation chamber 22.

As shown in FIG. 2, a substrate holder 23 may be disposed in the orientation chamber 22 to hold the substrate W while the substrate orientation is being performed. In some embodiments, the substrate holder 23 holds or secures the substrate W on its support surface (e.g., the shown upper surface) by vacuum force. However, other forces or clamping mechanisms can also be used in different embodiments. Moreover, a driving mechanism 24 may be coupled to the substrate holder 23 and configured to drive the substrate holder 23 and the substrate W thereon to rotate along a rotation shaft 23A. Accordingly, the substrate W is rotated during the orientation process.

An orientation detector 25 may also be disposed in the orientation chamber 22 and configured to detect the orientation of the substrate W. In some embodiments, the orientation detector 25 may detect a flat edge or other orientation features (e.g., orientation notches) of the substrate W by an optical mechanism. For example, the orientation detector 25 may include a light emitter and a light detector. The light emitter emits a light toward the edge of the substrate W during rotation of the substrate W. The light detector can receive the light reflected from the substrate W, thereby detecting the position of the flat edge or other orientation features of the substrate W. In some alternative embodiments, the orientation detector 25 may be another type of optical orientation detector, or the orientation detector 25 can detect the orientation of the substrate W by another suitable mechanism.

When the orientation detector 25 detects the flat edge or other orientation features of the substrate W, it generates a position signal and sends the position signal to a controller 26 (e.g., a computer). According to the position signal, the controller 26 controls the driving mechanism 24 to rotate the substrate holder 23 to a position where the substrate W is properly oriented for the subsequent manufacturing procedure(s). Then, the substrate W is transferred from the orientation chamber 22 to the process module(s) 14 for processing.

In some embodiments, as shown in FIG. 2, the orientation chamber 22 further includes a purging system 27 which is configured to inject a cleaning gas C1 into the orientation chamber 22 and remove contaminants from the orientation chamber 22. For example, the purging system 27 may be configured to inject the cleaning gas C1 into the orientation chamber 22 while the substrate orientation is being performed (i.e., during the orientation process) so as to remove particulate contaminants from the substrate W prior to the manufacturing procedure(s). The particulate contaminants may come from the environment within the transport carrier 21 and/or the EFEM 18. If the wafer W with particulate contaminants enters the process module(s) 14, the particulate contaminants can adversely affect the results (e.g., yield) of the manufacturing procedure(s).

In some embodiments, the purging system 27 may include a gas inlet pipe 271 configured to inject the cleaning gas C1 into the orientation chamber 22 and a gas outlet pipe 272 configured to remove the cleaning gas C1 (as well as the contaminants) from the orientation chamber 22. For example, the gas inlet pipe 271 may extend or be disposed over the substrate holder 23 for directing the cleaning gas C1 onto the upper surface of the substrate W, in some embodiments shown in FIG. 2. At least one gas source (not shown) can be fluidly connected to the gas inlet pipe 271 for supplying the cleaning gas C1. The gas outlet pipe 272 may be connected to a wall portion of the orientation chamber 22 and be located below the substrate holder 23 for exhausting the cleaning gas C1 flowing through the substrate W. An exhaust pump (not shown) is connected to the gas outlet pipe 272 for discharging the cleaning gas C1 at a constant flow rate. In some other embodiments, the position and/or quantity of the gas inlet pipe 271 and/or the gas outlet pipe 272 may vary.

In some embodiments, the orientation chamber 22 may include a door 221 (see FIG. 1) to physically separate the orientation chamber 22 from the EFEM 18. This allows the purge to be performed without contaminating the EFEM 18 or the rest of the semiconductor substrate processing system 10. In some other embodiments, the door 221 (and the gas outlet pipe 272) can be omitted, and the cleaning gas C1 can be exhausted by the gas handling system (not shown) connecting to the EFEM 18.

In some embodiments, the orientation chamber 22 may also be configured to perform a degassing process (which will be further described later) prior to loading the substrate W out of the semiconductor substrate processing system 10. The degassing process is performed after the substrate W is processed by the process module(s) 14 and transferred back to the orientation chamber 22. During the degassing process, the substrate W can be fixedly held by the substrate holder 23 (i.e., it does not rotate), in some embodiments shown in FIG. 5.

Figure 5:
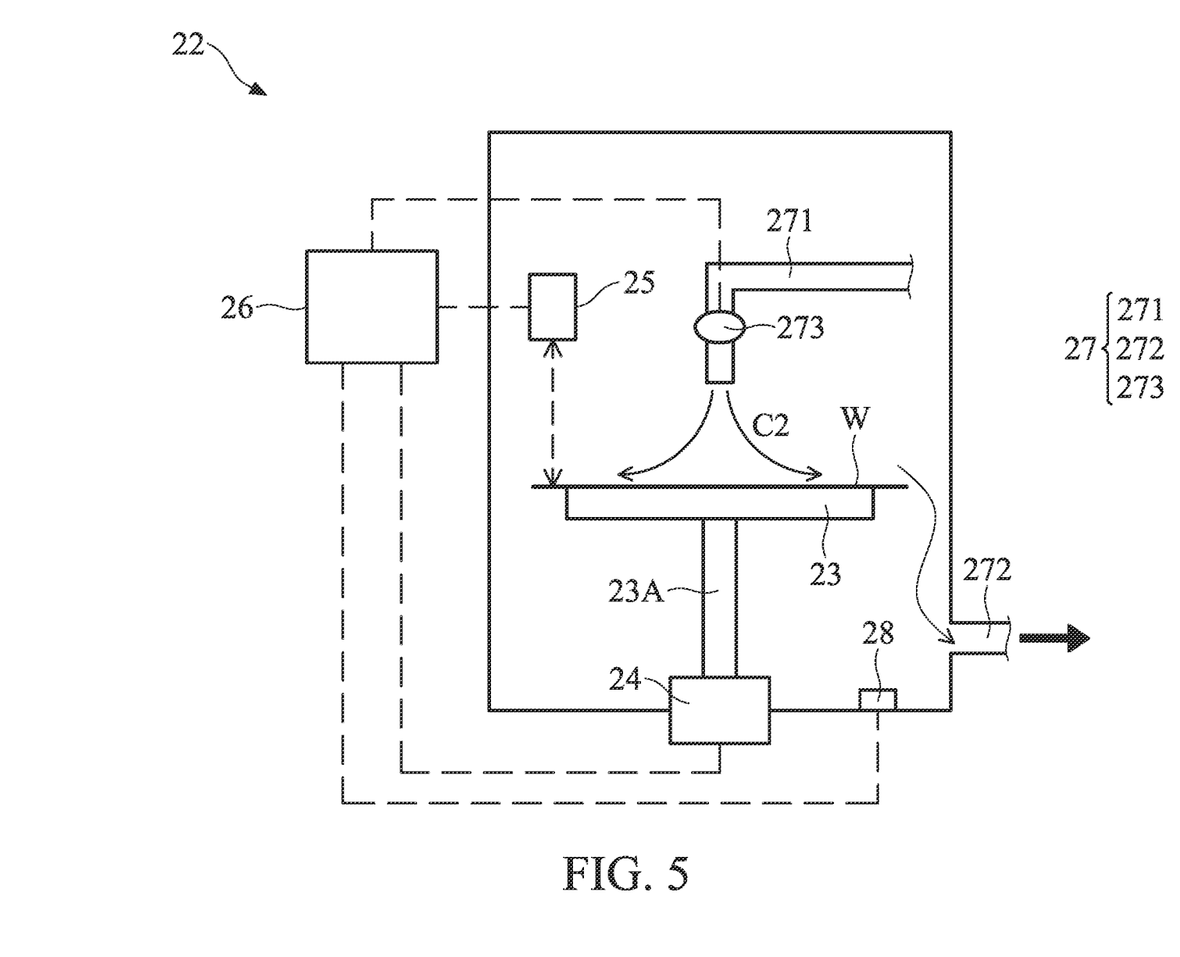
FIG. 5 is a schematic view showing a degassing process performed in the orientation chamber, in accordance with some embodiments.

To perform the degassing process, the purging system 27 (described above) can also be used (in similar way described above) to inject a cleaning gas C2 into the orientation chamber 22 for removing halogen gas (also referred to as contaminants) from the substrate W, as shown in FIG. 5. Halogen-bearing compounds are commonly used in substrate manufacturing procedures. These include $NF_3$, $CF_4$, $SF_6$, $CH_2F_2$, $CHF_3$, $C_2F_6$, $Cl_2$, $CHCl_3$, $CCl_4$, $BCl_3$, $HBr$, $CHBr_3$, and/or others. These compounds have the potential to adhere directly to the substrate W. In addition, the halogen may separate from the compound and bond with the substrate W. Bound halogens have the potential to outgas later and contaminate other substrates and tools.

In some embodiments, as shown in FIG. 2, a gas detector 28 is disposed in the orientation chamber 22 to detect compounds outgassed from the substrate W. The gas detector 28 may be used to detect a specific halogen including fluorine, chlorine, bromine, iodine, and/or a combination thereof. Moreover, the gas detector 28 generates a detection signal in response to the content of the specific halogen outgassed from the substrate W, and sends the detection signal to the controller 26. According to the detection signal, the controller 26 controls a gas regulator 273 (e.g., a throttle valve or a gas pressure controller) that is installed on the gas inlet pipe 271 to adjust the volume of cleaning gas C2 supplied into the orientation chamber 22 such that the cleaning gas volume is sufficient to remove the halogen gas from the substrate W.

Although the gas detector 28 is placed at the bottom of the orientation chamber 22 in the present embodiments, it can also be disposed at other suitable locations within the orientation chamber 22 in different embodiments. In addition, multiple gas detectors 28 can also be used.

Figure 3:
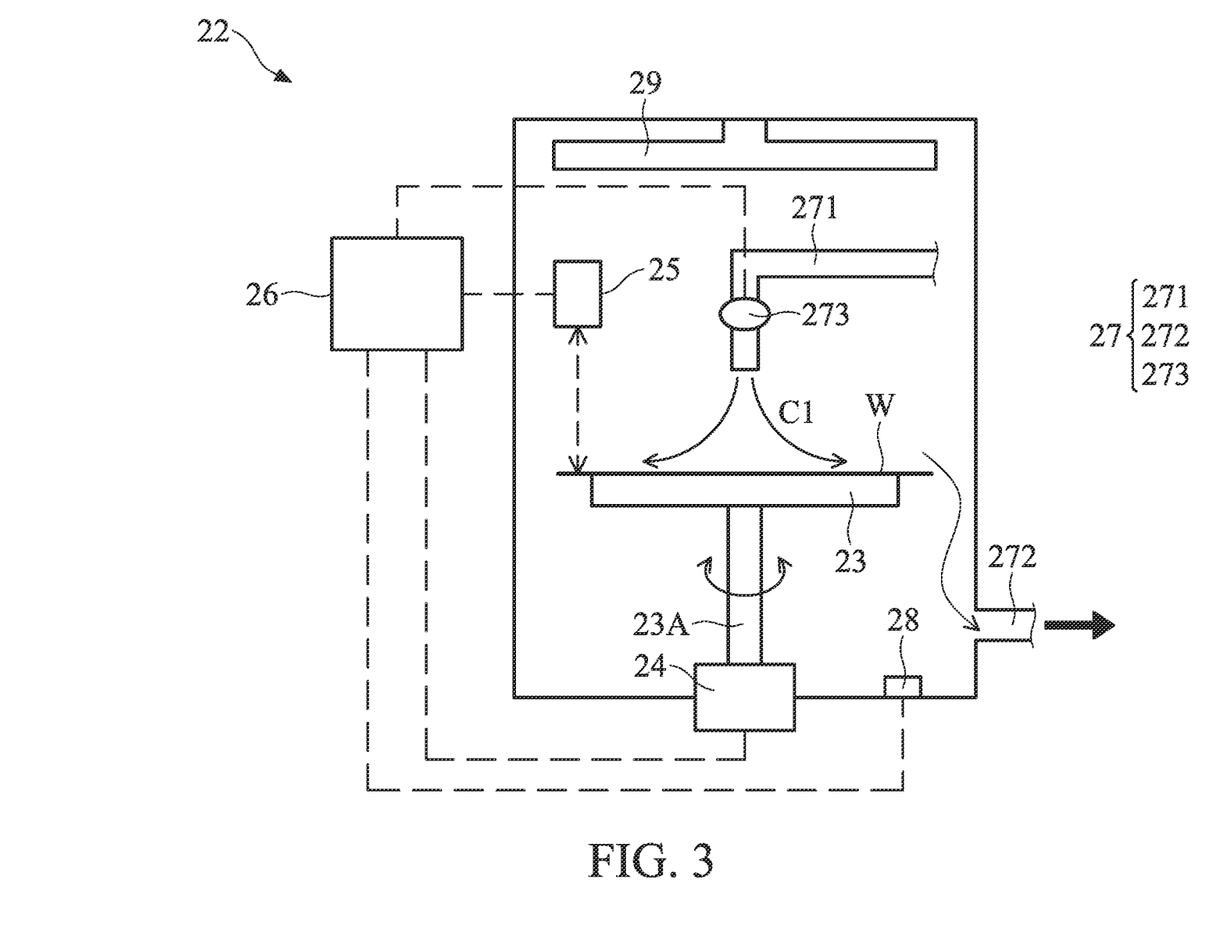
FIG. 3 is a schematic side view of the orientation chamber in FIG. 1, in accordance with some embodiments.

Referring to FIG. 3, in some other embodiments, an energy source 29 is further configured to provide energy to the substrate W to accelerate the outgassing of chemicals (i.e., halogens) on the substrate W. The energy source 29 may be an ultraviolet light source, a microwave emitter, a plasma generator, a heating mechanism, and/or another suitable energy source. In some embodiments, the energy source 29 may be disposed within the controlled environment of the orientation chamber 22, as shown in FIG. 3. In some alternative embodiments, the energy source 29 may be located outside the controlled environment and separated by a permeable barrier so that the energy source 29 can be serviced without contaminating the controlled environment.

As an example of a degassing process, the substrate W may be treated with ultraviolet light or microwaves via the energy source 29. The halogen gas is released from the substrate W and evacuated through the gas outlet pipe 272. In another example, the substrate may be heated via the energy source 29 to a temperature of not less than 100° C., and preferably between about 100° C. and 250° C. in a vacuum of <100 Torr. The heat and vacuum combine to draw the halogen gas from the substrate W. As a further example, the gas inlet pipe 271 may expose the substrate W to $H_2$. The energy source 29 in the form of a plasma generator creates H ions from $H_2$. Halogens bound to the substrate W reacts to form a gas which can be removed through the gas outlet pipe 272.

In some embodiments, the gas detector 28 sends a stop signal to the controller 26 when the specific halogen is no longer detected. Then, the controller 26 controls the gas regulator 273 or the purging system 27 to stop injecting the cleaning gas C2. Afterwards, the cleaned substrate W is transferred from the orientation chamber 22 to the transport carrier 21 by the transfer mechanism 19.

Figure 4:
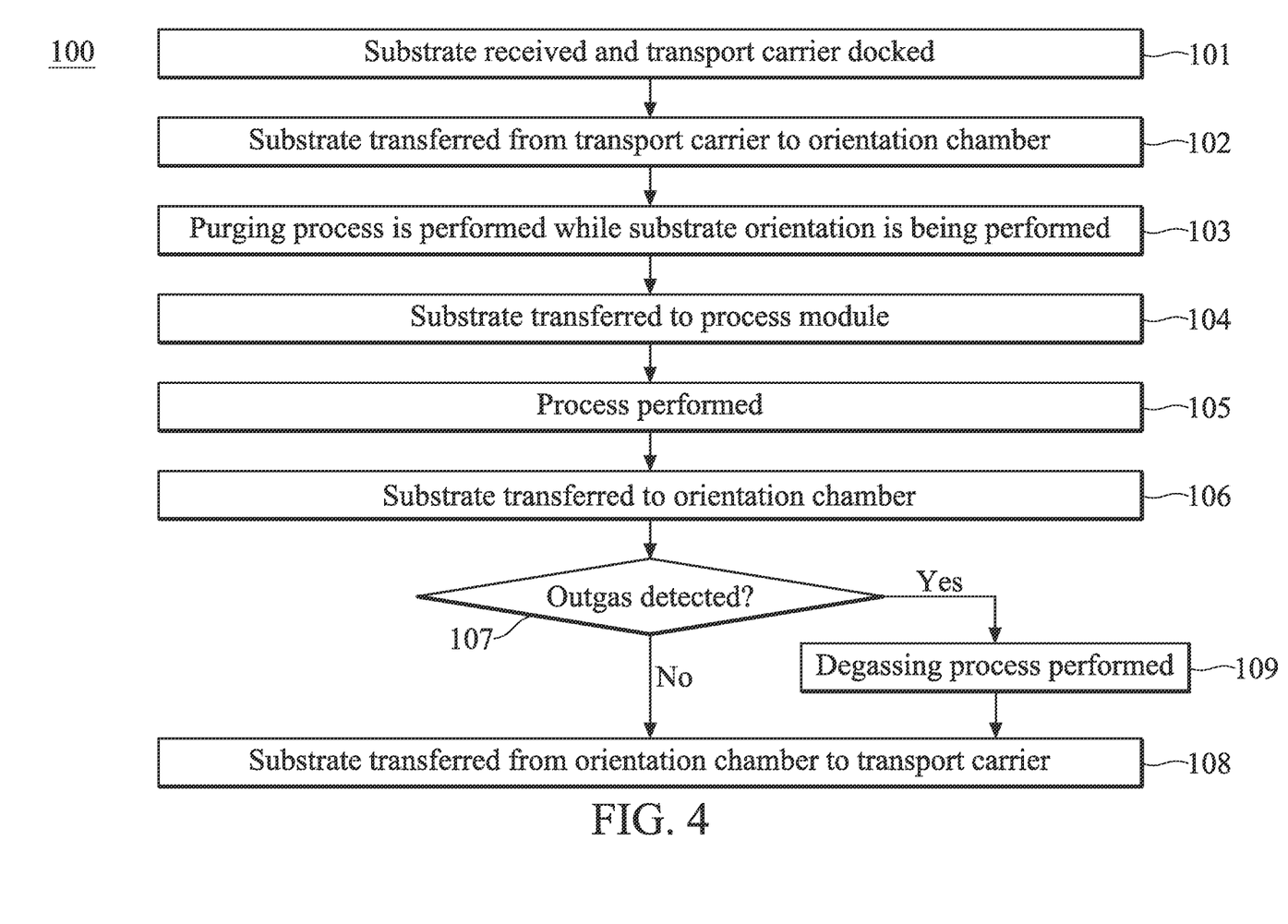
FIG. 4 is a simplified flowchart of a method of processing a semiconductor substrate, in accordance with some embodiments.

Next, referring to FIG. 4, which is a simplified flowchart of a method 100 of processing a semiconductor substrate using the semiconductor substrate processing system 10 described above, in accordance with some embodiments. For illustration, the flow chart will be described along with the drawings shown in FIGS. 1-3 and 5. Some of the described operations can be replaced or eliminated in different embodiments. Alternatively, some operations may be added in different embodiments. The method 100 includes a number of operations, such as operations 101, 102, 103, 104, 105, 106, 107, 108, 109.

In operation 101, the semiconductor substrate processing system 10 receives a substrate W (to be processed) contained within a transport carrier 21, and the transport carrier 21 is docked to a load port 20, as shown in FIG. 1.

In operation 102, the substrate W is removed from the transport carrier 21 by the transfer mechanism 19 of the EFEM 18 and inserted into the orientation chamber 22, as shown in FIG. 1.

In operation 103, a purging process is performed while a substrate orientation is being performed in the orientation chamber 22, as shown in FIG. 2. In some embodiments, the substrate orientation is performed by positioning the substrate W on the substrate holder 23 disposed in the orientation chamber 22; rotating the substrate holder 23 and the substrate W thereon by the driving mechanism 24; detecting an orientation, such as a flat edge or other orientation features, of the substrate W by the orientation detector 25 during the rotation of the substrate W; and according to the position signal output from the orientation detector 25, controlling the substrate holder 23, by the controller 26, to rotate to a position where the substrate W is properly oriented for the subsequent manufacturing procedure(s).

In some embodiments, in the process of substrate orientation, the purging process is simultaneously performed by injecting a cleaning gas into the orientation chamber 22, and removing the cleaning gas from the orientation chamber 22. For example, in some embodiments (see FIG. 2), the purging system 27 injects or directs a first cleaning gas C1 onto the upper surface of the substrate W through the gas inlet pipe 271, and discharges the first cleaning gas C1 out of the orientation chamber 22 through the gas outlet pipe 272. Accordingly, a flow of the first cleaning gas C1 passing through the upper surface of the substrate W removes particulate contaminants from the substrate W prior to the subsequent manufacturing procedure(s), thereby improving the performance of the manufacturing procedure(s). In addition, because the purging process is performed simultaneously with the substrate orientation, and time is saved.

In some embodiments, the first cleaning gas C1 (supplied during the orientation process) may be an inert gas such as $N_2$, Argon, and/or other noble gases; a reactive gas such as $O_3$, $O_2$, NO, water vapor, and/or clean dry air (CDA); other suitable purge gases; and/or any combination thereof.

In some embodiments, the first cleaning gas C1 is supplied or injected at a flow rate sufficient to remove the particulate contaminants from the substrate W. For example, the flow rate of the first cleaning gas C1 injected into the orientation chamber 22 may be between about 10 sccm and about 2000 sccm. In one particular example, the first cleaning gas C1 is CDA that flows over the upper surface of the substrate W at a flow rate of between about 100 sccm and about 1000 sccm.

In operation 104, the oriented substrate W is transferred to a process module 14. In some embodiments, as shown in FIG. 1, the oriented substrate W is transferred by the transfer mechanism 19 of the EFEM 18 to a load lock chamber 16, and then be transferred by the transfer mechanism 13 of the central transfer chamber 12 to a process module 14. It should be understood that many variations and modifications can be made to embodiments of the disclosure.

In operation 105, a manufacturing procedure is performed on the substrate W in the process module 14. In some embodiments, as shown in FIG. 1, if another manufacturing procedure is desired in another process module 14, the transfer mechanism 13 of the central transfer chamber 12 will transfer the substrate W to another process module 14 for further processing. If not, then the processed substrate W is transferred by the transfer mechanism 13 to a load lock chamber 16, and then be transferred by the transfer mechanism 19 back to the orientation chamber 22, in operation 106. It should be understood that many variations and modifications can be made to embodiments of the disclosure.

In operation 107, the gas detector 28 disposed in the orientation chamber 22 detects compounds outgassed from the substrate W. In some embodiments, the gas detector 28 may be used to detect a specific halogen including fluorine, chlorine, bromine, iodine, and/or a combination thereof. If no specific halogen is detected, the gas detector 28 sends a transfer signal to the controller 26 (see FIG. 2). Then, the controller 26 controls the transfer mechanism 19 (via an undrawn connecting means) to transfer the substrate W to another transport carrier 21 located at another load port 20, in operation 108. In various embodiments, after the transport carrier 21 is filled with the processed substrates W, it can be transported to the next processing system or inspection station.

If the specific halogen is detected, the gas detector 28 sends a purge signal to the controller 26. Then, the controller 26 controls the purging system 27 (via an undrawn connecting means) to inject a second cleaning C2 gas into the orientation chamber 22 through the gas inlet pipe 271 and discharge the second cleaning gas C2 out of the orientation chamber 22 through the gas outlet pipe 272 to perform the degassing process (see FIG. 5), in operation 109. The flow of the second cleaning gas C2 passing through the upper surface of the substrate W removes halogen gas from the substrate W. In some embodiments, the substrate W is fixedly held by the substrate holder 23 (i.e., it does not rotate) during the degassing process, as shown in FIG. 5.

In some embodiments, the second cleaning gas C2 (supplied during the degassing process) may be an inert gas such as $N_2$, Argon, and/or other noble gases; a reactive gas such as $O_3$, $O_2$, NO, water vapor, and/or clean dry air (CDA); other suitable purge gases; and/or any combination thereof. In some embodiments, the supplied second cleaning gas C2 is different from the first cleaning gas C1 (supplied during the substrate orientation). In one particular example, the purging system 27 may inject an inert gas or a reactive gas into the orientation chamber 22 to remove halogen gas from the substrate W during the degassing process (while the purging system 27 injects CDA into the orientation chamber 22 to remove particulate contaminants from the substrate W during the substrate orientation). However, the supplied second cleaning gas C2 and first cleaning gas C1 can be the same type of gas in some alternative embodiments.

In some embodiments, the gas detector 28 further generates a detection signal in response to the content of the specific halogen outgassed from the substrate W, and sends the detection signal to the controller 26. According to the detection signal, the controller 26 controls the gas regulator 273 installed on the gas inlet pipe 271 to adjust the volume of second cleaning gas C2 supplied into the orientation chamber 22.

In some embodiments, the supplied volume of second cleaning gas C2 is adjusted so that it is sufficient to remove the halogen gas from the substrate W. For example, a sufficient length of time for the second cleaning gas C2 to flow over the upper surface of the substrate W may be about 30 seconds when the flow rate of the second cleaning gas C2 injected into the orientation chamber 22 is between about 100 sccm and about 5000 sccm, which is equal to or greater than the flow rate of the first cleaning gas C1. In one particular example, the second cleaning gas C2 is an inert gas (e.g., $N_2$) that flows over the upper surface of the substrate W at a flow rate of between about 100 sccm and about 1000 sccm. In another particular example, the second cleaning gas C2 is a reactive gas (e.g., $O_2$) that flows over the upper surface of the substrate W at a flow rate of between about 100 sccm and about 5000 sccm.

In some embodiments, an energy source 29 is further configured to provide energy to the substrate W to accelerate the outgassing of chemicals (i.e., halogens) on the substrate W, as shown in FIG. 3. The energy source 29 may be an ultraviolet light source, a microwave emitter, a plasma generator, a heating mechanism, and/or another suitable energy source. After the halogen gas is released from the substrate W, it can be removed from the orientation chamber 22 through the gas outlet pipe 272.

In some embodiments, the gas detector 28 sends a stop signal to the controller 26 when the specific halogen is no longer detected. Then, the controller 26 controls the gas regulator 273 or the purging system 27 to stop injecting the cleaning gas C2. Afterwards, also under the control of the controller 26, the cleaned substrate W is transferred from the orientation chamber 22 to the transport carrier 21 by the transfer mechanism 19, in operation 108. After the transport carrier 21 is filled with the processed substrates W, it can be transported to the next processing system or inspection station in some embodiments.

The embodiments of the present disclosure have some advantageous features: the purge system provided to the orientation chamber can inject a cleaning gas into the orientation chamber to remove contaminants from the substrate. In some embodiments, the purge system may perform a purging process to remove particular contaminants on the substrate while the substrate orientation is being performed. Accordingly, the performance of the manufacturing procedure(s) performed after the substrate orientation can be improved, and time is saved. Alternatively or additionally, the purge system may cooperate with the gas detector to perform a degassing process to remove halogen gases from the substrate before the substrate is sent back to the transportation carrier. Accordingly, it can prevent the halogen gases outgassed from the substrate from contaminating other substrates and tools. As a result, the yield of the semiconductor substrate processing system is further improved. Furthermore, since the orientation chamber described above has a degassing function, no additional degassing chamber is required.

In some embodiments, an orientation chamber is provided. The orientation chamber includes a substrate holder, an orientation detector, and a purging system. The substrate holder is configured to hold a substrate. The orientation detector is configured to detect an orientation of the substrate. The purging system is configured to inject a cleaning gas into the orientation chamber and remove contaminants from the substrate. The purging system includes a gas regulator adjusting a volume of the cleaning gas supplied into the orientation chamber according to a detection signal output from a gas detector which indicates a content of a specific gas contaminant outgassed from the substrate.

In some embodiments, a method of processing a substrate is provided. The method includes providing a semiconductor substrate processing system for substrate processing which includes an orientation chamber and a process module. The method further includes orienting the substrate in the orientation chamber. The method further includes processing the substrate in the process module. The method further includes transferring the processed substrate from the process module to the orientation chamber. The method further includes conducting a degassing process by injecting a first cleaning gas into the orientation chamber to remove contaminants from the substrate.

In some embodiments, a method of processing a substrate is provided. The method includes injecting a first cleaning gas into an orientation chamber to remove particulate contaminants on the substrate while the substrate is oriented in the orientation chamber. The method further includes processing the substrate in a process module. The method further includes transferring the processed substrate from the process module to the orientation chamber. The method further includes injecting a second cleaning gas into the orientation chamber to remove halogen gas outgassed from the processed substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. An orientation chamber, comprising:
a substrate holder configured to hold a substrate;
an orientation detector configured to detect an orientation of the substrate; and a purging system configured to inject a cleaning gas into the orientation chamber and remove contaminants from the substrate;

wherein the purging system comprises a gas regulator adjusting a volume of the cleaning gas supplied into the orientation chamber according to a detection signal output from a gas detector which indicates a content of a specific gas contaminant outgassed from the substrate.

2. The orientation chamber as claimed in claim 1, wherein the purging system comprises a gas inlet pipe configured to inject the cleaning gas into the orientation chamber and direct the cleaning gas to the substrate.

3. The orientation chamber as claimed in claim 2, wherein the purging system further comprises a gas outlet pipe configured to remove the cleaning gas from the orientation chamber.

4. The orientation chamber as claimed in claim 2, wherein the gas regulator is installed on the gas inlet pipe.

5. The orientation chamber as claimed in claim 4, wherein the gas regulator or the purging system is controlled to stop injecting the cleaning gas when a specific halogen is not detected.

6. The orientation chamber as claimed in claim 1, wherein the cleaning gas is selected from a group consisting of inert gas, reactive gas, and clean dry air.

7. The orientation chamber as claimed in claim 1, further comprising an energy source configured to provide energy to the substrate to accelerate an outgassing of chemicals on the substrate.

8. The orientation chamber as claimed in claim 1, further comprising a driving mechanism configured to drive the substrate holder to rotate the substrate according to a position signal output from the orientation detector.

9. A method of processing a substrate, comprising:
providing a semiconductor substrate processing system for substrate processing which includes an orientation chamber and a process module;
orienting the substrate in the orientation chamber;
conducting a purging process on the substrate while orienting the substrate in the orientation chamber;
processing the substrate in the process module;
transferring the processed substrate from the process module to the orientation chamber; and
conducting a degassing process by injecting a first cleaning gas into the orientation chamber to remove contaminants from the substrate.

10. The method as claimed in claim 9, wherein injecting the first cleaning gas into the orientation chamber removes a halogen gas outgassed from the processed substrate.

11. The method as claimed in claim 10, further comprising a step of injecting the first cleaning gas into the orientation chamber by a purging system in the orientation chamber.

12. The method as claimed in claim 10, further comprising a step of detecting a specific halogen within the orientation chamber before the degassing process is conducted.

13. The method as claimed in claim 10, wherein the degassing process is conducted by further adjusting a volume of the first cleaning gas injected into the orientation chamber so that it is sufficient to remove the halogen gas from the processed substrate.

14. The method as claimed in claim 10, further comprising a step of providing energy to the substrate to accelerate the outgassing of the halogen gas on the substrate during the degassing process, by an energy source provide to the orientation chamber.

15. The method as claimed in claim 14, wherein the energy source is selected from a group consisting of an ultraviolet light source, a microwave emitter, a plasma generator, and a heating mechanism.

16. The method as claimed in claim 9, wherein the purging process is conducted by injecting a second cleaning gas into the orientation chamber to remove particulate contaminants on the substrate.

17. A method of processing a substrate, comprising:
injecting a first cleaning gas into an orientation chamber to remove particulate contaminants on the substrate while the substrate is oriented in the orientation chamber;
processing the substrate in a process module;
transferring the processed substrate from the process module to the orientation chamber;
injecting a second cleaning gas into the orientation chamber to remove halogen gas outgassed from the processed substrate when a specific halogen is detected; and
stop injecting the second cleaning gas into the orientation chamber when the specific halogen is not detected.

18. The method as claimed in claim 17, wherein a flow rate of the first cleaning gas injected into the orientation chamber is different from a flow rate of the second cleaning gas injected into the orientation chamber.

19. The method as claimed in claim 17, wherein the first cleaning gas is different from the second cleaning gas.

20. The method as claimed in claim 17, further comprising transferring the cleaned substrate from the orientation chamber to a transport carrier.

\* \* \* \* \*